(12) United States Patent
Fogel et al.

(10) Patent No.: US 9,818,909 B2
(45) Date of Patent: Nov. 14, 2017

(54) LED LIGHT EXTRACTION ENHANCEMENT ENABLED USING SELF-ASSEMBLED PARTICLES PATTERNED SURFACE

(71) Applicant: INTERNATIONAL BUSINESS MACHINES CORPORATION, Armonk, NY (US)

(72) Inventors: Keith E. Fogel, Hopewell Junction, NY (US); Jeehwan Kim, Los Angeles, CA (US); Ning Li, White Plains, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 14/744,786

(22) Filed: Jun. 19, 2015

(65) Prior Publication Data
US 2016/0276524 A1    Sep. 22, 2016

Related U.S. Application Data

(63) Continuation of application No. 14/659,114, filed on Mar. 16, 2015.

(51) Int. Cl.
*H01L 33/00* (2010.01)
*H01L 51/56* (2006.01)
*H01L 51/52* (2006.01)
*H01L 33/22* (2010.01)

(52) U.S. Cl.
CPC ...... *H01L 33/0095* (2013.01); *H01L 51/5262* (2013.01); *H01L 51/56* (2013.01); *H01L 33/22* (2013.01)

(58) Field of Classification Search
CPC .................... H01L 33/26; H01L 51/5262
USPC .......................................... 438/29
See application file for complete search history.

(56) References Cited

U.S. PATENT DOCUMENTS

| | | | |
|---|---|---|---|
| 7,071,617 B2 | 7/2006 | Utsumi et al. | |
| 7,851,045 B2 | 12/2010 | Gandon et al. | |
| 8,427,043 B2 | 4/2013 | Tchakarov et al. | |
| 2005/0202587 A1* | 9/2005 | Redecker | G09F 9/30 438/99 |
| 2010/0207520 A1 | 8/2010 | Zhu et al. | |

(Continued)

OTHER PUBLICATIONS

Shin, J.W. et al., "Random nano-structures as light extraction functionals for organic light-emitting diode applications," Organic Electronics, vol. 15, Issue 1, Jan. 2014. (pp. 196-202).*

(Continued)

*Primary Examiner* — Tuan Nguyen
(74) *Attorney, Agent, or Firm* — Tutunjian & Bitetto, P.C.; Louis J. Percello (57) ABSTRACT

A light emitting diode (LED) containing device including a light emitting diode (LED) structure, and a light transmissive substrate in contact with the LED structure. The light transmissive substrate has a texture surface tuned to include features with dimensions greater than a wavelength of light produced by the LED structure. In some embodiments, increasing the feature size of the texture to be comparable to the wavelength of light produced by the LED increases light extraction from the LED in comparison to when the feature size of the texture is substantially less or substantially larger than the wavelength of light.

16 Claims, 4 Drawing Sheets

(56) References Cited

U.S. PATENT DOCUMENTS

| | | |
|---|---|---|
| 2011/0236631 A1 | 9/2011 | Bisson et al. |
| 2012/0112224 A1 | 5/2012 | Le Bellac et al. |
| 2013/0181242 A1 | 7/2013 | Cho |
| 2013/0323468 A1 | 12/2013 | Myers et al. |

OTHER PUBLICATIONS

List of IBM Patents or Patent Applications Treated as Related.
Loicq, J. et al., "OLED Light extraction improvement with surface nano-micro texturation based on speckle lithography," SPIE Photonics Europe, vol. 8435, Apr. 2012. (16 Pages).

* cited by examiner

LED LIGHT EXTRACTION ENHANCEMENT ENABLED USING SELF-ASSEMBLED PARTICLES PATTERNED SURFACE

CROSS REFERENCE TO RELATED APPLICATIONS

This application is a Continuation application of co-pending U.S. patent application Ser. No. 14/659,114, filed on Mar. 16, 2015, incorporated herein by reference in its entirety.

BACKGROUND

Technical Field

The present disclosure relates to light emitting devices (LEDs), and more particularly to improving light extraction from LEDs.

Description of the Related Art

Light rays generated in a luminescent medium with higher index of refraction than the exit medium, typically air, are submitted to the total internal reflection phenomenon (TIR). Consequently, rays which are in the conditions of TIR will be trapped and guided into the material. Because light is generated without any preferential direction, this trapping effect affects the out coupling efficiency of the light emitting device, such as LED and OLED devices, for instance, and all sources which could be seen as an internal source with higher refractive index than the exit medium. The trapped light is then re-adsorbed in the device and could turn into heat that may impact the device performances and lifetimes.

SUMMARY

In one embodiment, the present disclosure provides a method for fabricating a light emitting device (LED) that may include providing a light emitting diode (LED) structure that is present on a light transmissive substrate, and forming a metal containing layer on a surface of the substrate. The metal containing layer is annealed to provide a plurality of metal particles. The exposed portions of the light transmissive substrate are etched using the plurality of metal particles as an etch mask to form a textured surface having a plurality of features with dimensions that are tuned to be comparable in dimension with a wavelength of light produced by the LED. The plurality of metal particles is removed. The method increases light extraction from the LED structure. For example, tuning the feature size of the texture to be comparable in dimension to the wavelength of light increases light extraction from the light emitting device in comparison to when the feature size of the texture is substantially less or substantially more than the wavelength of light.

In another embodiment of the present disclosure, a method of fabricating a light emitting device is provided that includes providing a light emitting diode (LED) structure that is present on a light transmissive substrate. A metal containing layer may then be formed on a surface of the light transmissive substrate and annealed. The layer thickness and anneal temperature for the metal containing layer can be tuned to provide a plurality of metal particles for an etch mask. The etch mask is tuned to provide a pattern with a feature size for a textured surface that is comparable in dimension to a wavelength of light produced by the LED structure. The light transmissive substrate is then etched using the etch mask to transfer the pattern including said features size into said light transmissive substrate providing a texture in the light transmissive substrate, wherein the feature size of the texture is comparable in dimension with a wavelength of light being produced by said LED. The method increases light extraction from the LED structure. For example, tuning the feature size of the texture to be comparable in dimension to the wavelength of light increases light extraction from the light emitting device in comparison to when the feature size of the texture is substantially less or substantially more than the wavelength of light.

In another aspect, a light emitting diode (LED) containing device is providing that includes a light emitting diode (LED) structure, and a light transmissive substrate in contact with the LED structure. The light transmissive substrate has a texture surface tuned to include features with dimensions comparable in dimension with the wavelength of light produced by the LED structure.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles provide light emitting devices (LEDs), and methods for fabrication that have improved light emission characteristics. In LED devices, it has been determined that light can be trapped in the guided mode of substrate, and can be one of the primary limiting factors of device efficiency. Light can also be trapped in the surface plasmon mode of the electrode. Texturing a surface can enhance light extraction. The texturing process can be applied to both inorganic light emitting diodes (LEDs) and organic light emitting diodes (OLEDs). In some embodiments, the methods and structures that are disclosed herein can maximize the light extraction by tuning the feature size of the textured surface. In some embodiments, the methods and structures disclosed herein employ an etch mask of self-assembled metal particles as the mask to pattern the substrate, and enhance the efficiency of the device. In some embodiments, the advantages of the methods and structures disclosed herein include that the feature size is tunable by tuning the metal particle self-assemble condition, so that the best morphology can be optimized. The processes disclosed herein are also low cost due to the self-assemble process without using any lithographically patterned definition process.

In some embodiment, the metal particle self-assembled mask may be provided by a solder pattern. Solder patterns may be self-assembled relying on surface tension to form the dots during an anneal process. However, simply letting the solder dots form on their own leads to areas of higher and lower density concentrations of dots as well as dots of varying size. To significantly improve uniformity, the present principles provide methods to assist in more evenly spacing the later-formed solder dots and to provide more size uniformity. In this way, the spacings and sizes of the dots may be controlled to optimize the formation of textured substrates employed in LEDs to provide LEDs with optimized light extraction performance.

It is to be understood that the concepts of the present disclosure will be described in terms of a given illustrative structure; however, other structures, substrate materials and process features and steps may be varied within the scope of the present disclosure. It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Referring now to the drawings in which like numerals represent the same or similar elements, a process for forming light emitting device (LED) is illustratively shown. In some embodiments, the present process may provide a textured surface of a light transmissive structure without relying upon photolithography and photoresist compositions.

As used herein, the term "LED" denotes a light emitting active material containing structure that emits light when an electrical current is passed through it. For example, the LED may be an organic light-emitting diode (OLED). An OLED is a light-emitting diode (LED), in which the emissive electroluminescent layer is a film of organic compound which emits light in response to an electric current. This layer of organic semiconductor is situated between two electrodes; typically, at least one of these electrodes is transparent. Two main families of OLED that are suitable for use with the methods and structures disclosed herein include those based on small molecules and those employing polymers. Adding mobile ions to an OLED creates a light-emitting electrochemical cell (LECH), which can have a slightly different mode of operation. Examples of polymeric materials that can emit light in response to the application of electrical current include, but are not limited to: poly(phenylene vinylene), polythiophenes, polypyridines, poly(pyridyl vinylenes), polyphenylenes and copolymers of these materials.

In other embodiments of the present disclosure, the light-emitting diode (LED) may include a semiconductor light source, which can resemble a pn-junction diode. In this example, when a voltage is applied to the leads to the pn-junction type diode, electrons are able to recombine with electron holes within the device, releasing energy in the form of photons. It is noted that any LED structure is suitable for use with the present disclosure.

Figure 1:
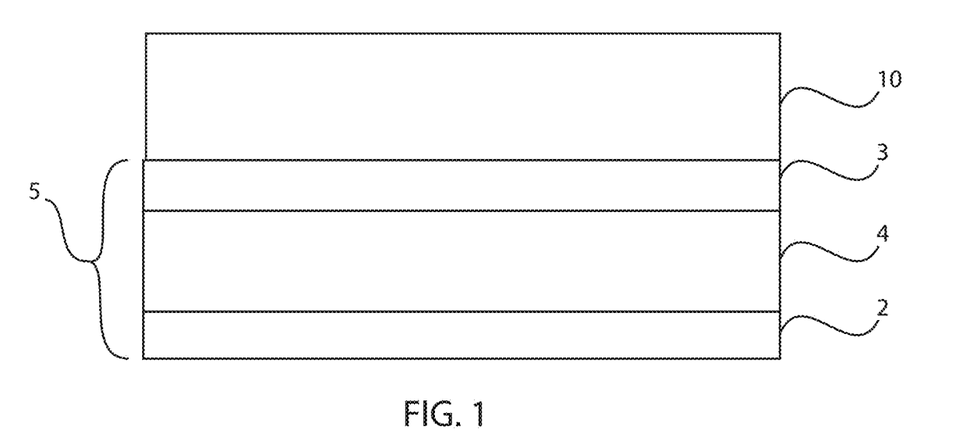
FIG. 1 is a side cross-section view depicting a light emitting diode (LED) structure that is present on a light transmissive substrate, in accordance with one embodiment of the present disclosure.

Referring to FIG. 1, in one embodiment, the method for fabricating a light emitting device may begin with providing a light emitting diode (LED) structure 5 on a light transmissive substrate 10. The light transmissive substrate 10 may include silicon or a silicon-containing material, and may include glass, quartz, single (monocrystalline) silicon, etc. While other substrate materials may be employed, silicon based materials including glass are preferred. The term "light transmissive" or "light transmitting" denotes that the material allows for the transmission of light there through. For example, the light transmissive substrate 10 may allow for visible light, e.g., light having a wavelength of approximately 400 nm to approximately 700 nm, to be transmitted there through. In one example, the light transmissive substrate 10 may have a refractive index that is equal to approximately n=1.5.

FIG. 1 further depicts a light emitting device (LED) structure 5 that is present on the light transmissive substrate 10. The LED structure 5 may include an organic light emitting diode (OLED). In the embodiments including an OLED, the LED structure 5 may include a transparent conductive electrode (TCE) 3 present between the light transmissive substrate 10 and the one or more organic light emitting material layers 4, i.e., light emitting active element, of the LED structure 5. The LED structure 5 may also include a cathode 2 of the one or more organic light emitting material layers 4 that is opposite the surface of the one or more organic light emitting material layers 4 that is in contact with the transparent conductive electrode (TCE) 3.

In some embodiments, the transparent conductive electrode (TCE) 3 may be composed of a transparent conductive material, such as a transparent conductive oxide. Examples include but are not limited to indium-tin-oxide (ITO), fluorine doped tin oxide and aluminum-doped zinc-oxide (AZO). In some embodiments, the thickness of the transparent conductive electrode (TCE) 3 may range from 10 nm to 500 nm. The transparent conductive electrode (TCE) 3 may provide the anode of the device. The deposition process for forming the transparent conductive electrode (TCE) 3 may include a chemical vapor deposition (CVD), such as plasma enhanced CVD (PECVD); physical vapor deposition (PVD), such as sputtering; or other suitable deposition process, such as layer transfer. The transparent conductive electrode (TCE) 3 may have a refractive index that is equal to approximately n=1.9.

The one or more organic light emitting material layers 4 may include conducting polymers selected from the group consisting of polyacetylenes (PA), polyanilines (PANI), polypyrroles (PPy), polythiophenes (PT), poly-para-phenylenes (PPP), poly-para-phenylene-vinylenes (PPV) and combinations thereof. The one or more organic light emitting material layers 4 may also include oligomers and small molecules, such as oligoacenes, oligothiophenes, triarylamines, oligo-para-phenylenes and combinations thereof. In some embodiments, the one or more organic light emitting material layers 4 may include at least one hole transport layer and at least one electron transport/emissive layer having a composition selected from the group consisting of N,N'-Bis(naphthalen-1-yl)-N,N'-bis(phenyl)benzidine ($C_{44}H_{32}N_2$)(NPB), 2-TNATA, 4,4',4"-Tris-(N-(naphthylen-2-yl)-N-phenylamine)triphenylamine ($C_{66}H48N4$) (TNATA), Tris(4-carbazoyl-9-ylphenyl)amine ($C_{54}H_{36}N_4$) (TCTA), 1,3,5-tris[4-(diphenylamino)phenyl]-benzene (TDAPB), TDATA, Tris(8-hydroxyquinolinato)aluminum ($Al(C_9H_6NO)_3$)(Alq3), Bis(2-methyl-8-quinolinolato-N1, $O_8$)-(1,1'-Biphenyl-4-olato)aluminum ($C_{32}H_{25}AlN_2O_3$) (Balq), 4,4'-Bis(N-carbazolyl)-1,1'-biphenyl ($C_{36}H_{24}N_2$) (CBP) and combinations thereof. The at least one or more organic light emitting material layers 4 may be formed using a deposition process, such as spin on deposition. Other deposition processes are also suitable for forming the one or more organic light emitting material layers 4, which may include layer transfer methods. The at least one or more organic light emitting material layers 4 can have a refractive index that is less than the refractive index of the transparent conductive electrode (TCE) 3, and is more than the refractive index of the glass substrate, i.e., light transmissive substrate 10. The at least one or more organic light emitting material layers 4 can have a refractive index on the order of approximately n=1.8.

Referring to FIG. 1, the cathode layer 2 be present on the opposite surface of the at least one or more organic light emitting material layers 4 from the surface of the at least one or more organic light emitting material layers 4 that the transparent conductive electrode (TCE) 3 is in contact with. The cathode layer 2 may include a transparent conductive material, such as a transparent conductive oxide (e.g., zinc oxide, indium tin oxide, indium zinc oxide, etc.), ultra-thin metal (e.g., 20 nm or less in thickness) or other conductive structure. The deposition process for forming the cathode layer 2 may include a CVD, PECVD or other suitable deposition process.

It is noted that the layers provided for the LED structure 5 depicted in FIG. 1 is not intended to be an exclusive list, as other materials layers may be present in conjunction with those depicted, such as buffer layers, diffusion layers, barrier layers and combinations thereof, etc.

Additionally, as noted above, the LED structure 5 is not limited to only OLED structures. For example, an LED structure 5 including a light emitting active element of semiconductor material, e.g., inorganic semiconductor material, is also within the scope of the present disclosure. In some embodiments, in which the LED structure 5 includes an inorganic LED structure, a light emitting active element of one or more III-V semiconductor materials may be substituted for the at least one or more organic light emitting material layers 4 of the structure depicted in FIG. 1. The one or more III-V semiconductor material layers substituted for the one or more organic light emitting material layers 4 can be selected from the group of (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. In some embodiments, material layers including some of the aforementioned semiconductor materials may be selected in a two-lead semiconductor light source, which can resemble a pn-junction diode. In this example, when a voltage is applied to the leads to the pn-junction type diode, electrons are able to recombine with electron holes within the device, releasing energy in the form of photons. In some examples, a laser diode may be provided. The laser diode is an electrically pumped semiconductor laser in which the active medium is formed by a p-n junction of a semiconductor diode similar to that found in a light-emitting diode. A laser diode is electrically a p-i-n diode. The active region of the laser diode is in the intrinsic (I) region, and the carriers, electrons and holes, are pumped into it from the N and P regions (n-type doped regions or p-type doped regions) respectively.

It is noted that the above description of semiconductor materials for an LED structure 5 of inorganic materials, or organic materials for an OLED, are illustrative only, and are not intended to limit the present disclosure to the above examples, as any material capable of providing an LED structure 5 is suitable for use with the present disclosure.

Figure 2:
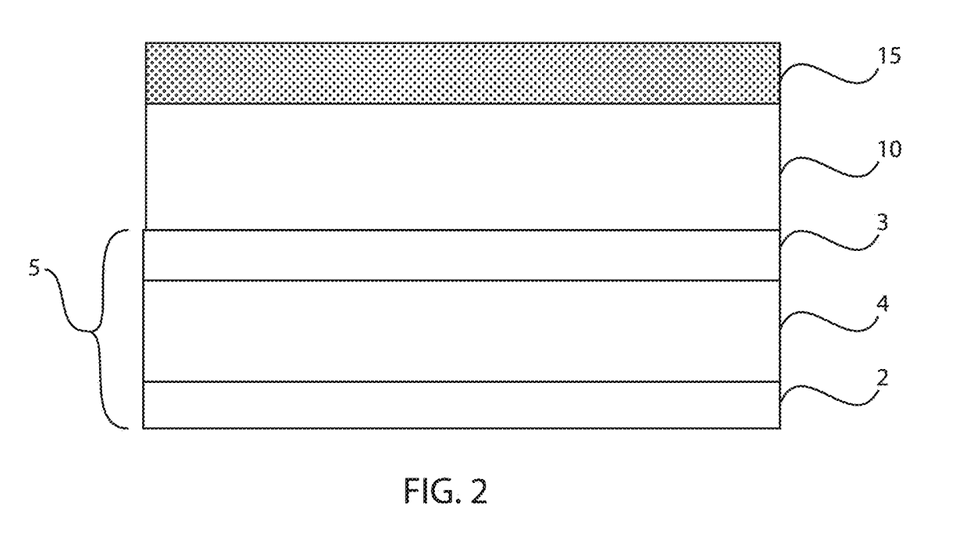
FIG. 2 is a side cross-sectional view depicting depositing a metal containing layer on a light transmissive substrate, in accordance with one embodiment of the present disclosure.

FIG. 2 depicting one embodiment of depositing a metal containing layer 15 on the light transmissive substrate 10. In some examples, a cleaning process may be performed on the light transmissive substrate 10 prior to depositing the metal containing layer. The cleaning process may include a solvent, such as acetone, isopropyl alcohol (IPA), deionized water or the like alone or in combination. Other solvents may be employed as well.

In some embodiments, a process is employed to remove impurities inside a processing chamber prior to forming the metal containing layer 15 on the light transmissive substrate 10 so that a more homogeneous deposition of metal containing material on the light transmissive substrate 10 is possible. In one embodiment, titanium or other metal is evaporated in a chamber with a chamber shutter closed, which provides a getter function in removing contaminates from the processing chamber. Then, the metal containing layer 15, which may be composed of solder, is deposited on the substrate and annealed resulting in a uniformly distributed matrix of solder dots. The solder dots can be controllably grown to a desired size by controlling initial solder deposition thickness. The details of this process are now provided in greater detail.

The light transmissive substrate 10 (including the LED structure 5) is placed in a processing chamber, e.g., an evaporation chamber. A gettering process is performed in the chamber with a shutter closed between a source of the getter material and the light transmissive substrate 10. The gettering removes impurities which also results in lowering the chamber pressure. The getter metals may include titanium or other metals, e.g., molybdenum, chromium, etc. Gettering is concerned with "clean-up" of residual gases by removing the gases from a vacuum vessel, such as the processing chamber. Gettering here refers to chemical gettering. A chemical getter provides a pumping action by a chemical reaction where a chemically active gas combines with a chemically active metal to form a low vapor pressure solid compound. The chemically active metal can be either an element or an alloy that, for convenience, can be called a getter metal or material, which may be employed to reduce or eliminate oxygen, nitrogen, carbon dioxide, hydrogen, hydrocarbons, etc. from the chamber by forming a low vapor pressure compound such that the active gas is permanently removed from the vacuum chamber.

An evaporable getter may include a sublimation pump. A sublimation pump operates by heating the gettering material directly or indirectly by radiation from a filament or source to cause sublimation. Once sublimed into the vapor state, the gettering material is allowed to condense on an internal array or on a portion of an inner surface of the chamber. As it condenses into a thin film, the gettering material becomes a pump for active gases and $H_2$.

In one embodiment, titanium is evaporated in the processing chamber. The processing chamber includes a source crucible (or other source such as a filament) that is isolated or blocked from the light transmissive substrate 10 during evaporation so that no getter materials are deposited on the light transmissive substrate 10, but the chamber and potentially the light transmissive substrate 10 are cleaned by the gettering. In this illustrative embodiment, the titanium is evaporated for 180 to 300 seconds at a chamber pressure of between $1 \times 10^{-6}$ to about $5 \times 10^{-6}$ Torr. However, chamber pressure below $1 \times 10^{-6}$ may also be employed.

The getter material evaporation is done with the evaporation shutter closed so that no getter materials are deposited on light transmissive substrate 10, but the process still removes impurities inside the chamber since getter materials easily react with impurities that are or include, e.g., carbon, oxygen and hydrogen.

Figure 3:
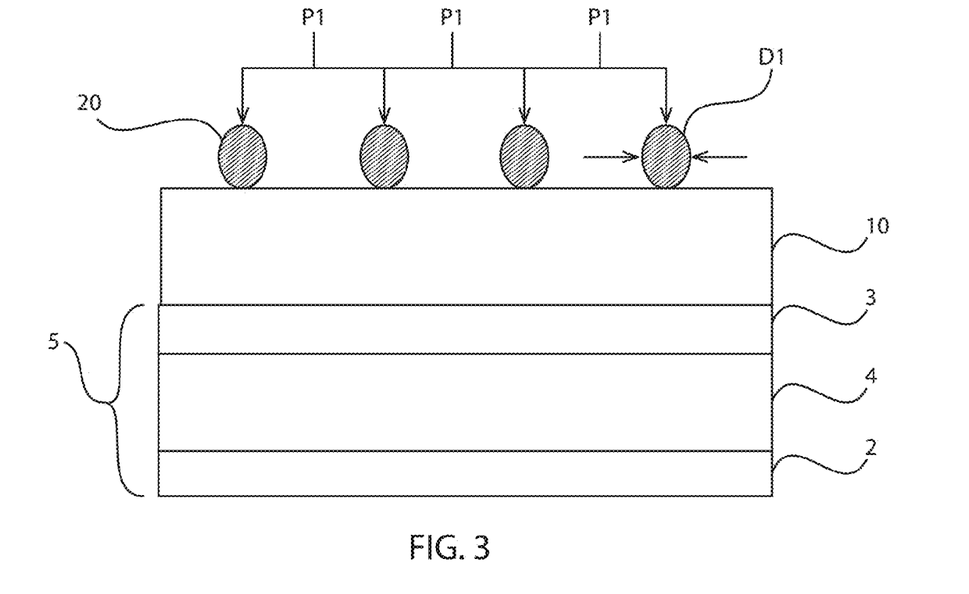
FIG. 3 is a side cross-sectional view depicting annealing the metal containing layer to provide a plurality of metal particles having a size and density that is tuned to form an etch mask that produces a textured surface etched into the light transmissive substrate having a feature size that is comparable in dimension to a wavelength of light being emitted by the light emitting diode (LED) structure 5, in accordance with one embodiment of the present disclosure.

The above described getter process is optional, and may be omitted. Referring to FIG. 2, a metal containing layer 15, e.g., solder metal layer, is deposited over the light transmissive substrate 10. In the processing chamber, the shutter is opened up to permit deposition of the metal containing layer 15. The metal containing layer 15, e.g., solder material layer, may include Sn, Pb, Sb, Bi, etc. or combinations thereof. In particularly useful embodiments, Sn solder or solders including Sn are employed. The metal containing layer 15 may include a thickness of between about 900 Angstroms to about 2400 Angstroms. In another embodiment, the metal containing layer 15 may include a thickness of between about 1000 Angstroms to about 2000 Angstroms. In one example, the metal containing layer 15 may include a thickness of about 1200 Angstroms. The metal containing layer 15 may be formed by employing a thermal evaporation method with a deposition rate of between about 1 Angstrom per second to about 5 Angstroms per second. By controlling the thickness of the metal containing layer 15, later-formed solder dot size may be controlled. [0001] FIG. 3 depicts annealing the metal containing layer 15 to provide a plurality of metal particles 20 having a size and density that can be tuned to form an etch mask that produces a textured surface etched into the light transmissive substrate 10 having a feature size that is comparable to the wavelength of light being emitted by the light emitting diode (LED) structure 5. The anneal process, such as a rapid thermal anneal (RTA), is applied to the structure such that metal containing layer, e.g., solder metal layer, forms metal particles 20, e.g., solder balls or solder dots. Although not always requiring a solder containing composition, the metal particles produced by annealing the metal containing layer 15 are hereafter referred to as solder balls 20. The solder balls 20 form uniformly (e.g., have a substantially uniform density) such that the dots coalesce and grow based on surface tension. In one embodiment, the RTA may illustratively include a temperature of between 400 degrees C. to about 550 degrees C. for about 10 seconds to about one minute. In another embodiment, the RTA may illustratively include a temperature of between 450 degrees C. to about 500 degrees C. for about 10 seconds to about one minute. In yet another embodiment, the RTA may illustratively include a temperature of between 475 degrees C. to about 495 degrees C. for about 10 seconds to about one minute. The temperatures and times may vary depending on the solder material and the desired results.

The thickness of the deposited metal containing layer 15, and the temperature and time of the annealing process is tailored to tune the size and density of the solder balls 20 to function as an etch mask that in conjunction with a etch texturing process applied to the exposed portions of the light transmissive substrate 10 produces features etched into the light transmissive substrate 10, i.e., textured surface, having a width and height dimension that are comparable in dimension with the wavelength of the light being produced by the LED structure 5. As further described below, forming a textured surface having a feature size comparable in dimension with the wavelength of the light produced by the LED structure 5 substantially reduces the reflectance of light waves produced by the LED structure 5 that is contacting the textured surface of the light transmissive substrate 10. By reducing the reflectance of the light waves produced by the LED structure 5 with the later formed textured surface of the light transmissive substrate 10, the methods and structures disclosed herein reduce light trapping in LED containing devices. In some embodiments, this greatly enhanced light extraction and the efficiency of the LED containing device in comparison to the prior LED structures that do not include a textured surface, or fail to provide a textured surface having feature sizes equivalent to those provided by the present disclosure.

The solder balls 20 are typically substantially circular, but some embodiments do allow for some oblong geometries for the solder balls 20.

In some embodiments, to provide for enhanced light extraction from LED containing devices, the thickness of the metal containing layer, and the annealing process is selected to provide solder balls 20 having a diameter D1 ranging from 0.4 microns to 1.5 microns. In another embodiment, the thickness of the metal containing layer, and the annealing process is selected to provide solder balls 20 having a diameter D1 ranging from 0.5 microns to 1.0 microns. In yet another embodiment, the thickness of the metal containing layer, and the annealing process is selected to provide solder balls 20 having a diameter D1 ranging from 0.55 microns to 1.0 micron. In an even further embodiment, the thickness of the metal containing layer, and the annealing process is selected to provide solder balls 20 having a diameter D1 ranging from 0.75 microns to 1.0 micron. The size of the solder balls 20 throughout the entire plurality of solder balls 20 may be uniform.

The thickness of the metal containing layer, and the annealing process of the methods described herein also provide a uniform dispersion of solder balls 20. This means that aggregation of the solder balls 20, i.e., agglomeration of solder balls into clusters, is substantially eliminated, and that adjacent solder balls are separated for a substantially uniform pitch P1. The pitch P1 is the center to center distance separating adjacent solder balls. In some embodiments, the pitch P1 may range from 0.4 microns to 1.5 microns. In another embodiment, the pitch P1 may range from 0.5 microns to 1.0 microns. In one example, the pitch P1 is on the order of 0.6 microns.

Figure 4:
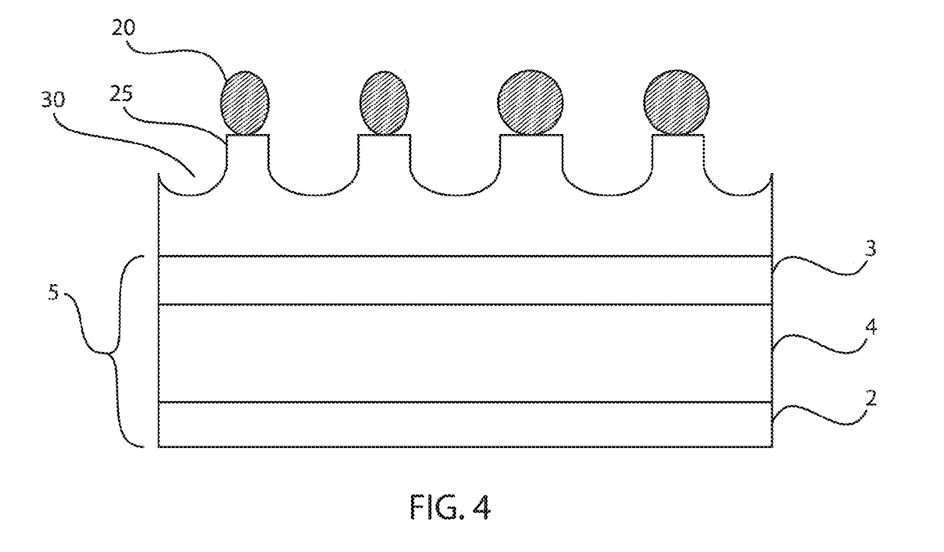
FIG. 4 is a side cross-sectional view depicting etching the light transmissive substrate with an etch chemistry that is selective to the plurality of metal particles to provide a texture to the substrate having said feature size that is comparable in dimension with the wavelength of said light being emitted by said LED.

Referring to FIG. 4, an etch process is employed to etch the exposed portions of the light transmissive substrate 10 using the plurality of solder balls 20 as an etch mask to form a textured surface in the light transmissive substrate 10. The etched portions of the transmissive substrate, which are recessed relative to their position prior to etching, may be referred to as trenches 30 that are separating the adjacent features 25. The features 25 of the textured surface of the light transmissive substrate 10 have an upper surface that was protected from being etched by the solder balls 20. The etch process employs the solder balls 20 as an etch mask. In some embodiments, for Si and/or glass dry etching, tetrafluoromethane ($CF_4$) plasma is employed. Reactive ion etching parameters may include, e.g., a 30 minute etch at 300 Watts of power and at a pressure of about 100 mTorr. Etch depth, i.e., depth for the trenches 30, may be approximately 0.5 to 4 microns, although other parameters and dimensions may be used and are effective.

The etch process is employed to transfer the pattern from of the solder balls 20 into the light transmissive substrate 10 (e.g., silicon or glass) utilizing a dry etch gas chemistry appropriate for etching the light transmissive substrate 10 with respect to the pattern of solder dots 20.

The etch process for forming the textured surface of the light transmissive substrate 10, which provides the features having height and width dimensions that are comparable to the light wavelength provided by the LED structure 5, is typically a selective etch process. As used herein, the term "selective" in reference to a material removal process denotes that the rate of material removal for a first material is greater than the rate of removal for at least another material of the structure to which the material removal process is being applied. The selectivity for removing the exposed material of the light transmissive substrate 10 may be so great that the solder dots 20 are effectively not etched by the etch process that forms the trenches 30 in the exposed portions of the light transmissive substrate 10. This provides that the features 25 have a plateaued upper surface with a width W1 substantially equal to the diameter D1 of the solder balls 20. Because the diameter D1 of the solder balls 20 is comparable in dimension with the wavelength of the light produced by the LED device 5, the width W1 of the plateaued upper surface of the features 25 is also comparable in dimension with the wavelength of the light produced by the LED device 5, which provides for reduced light trapping, i.e., enhanced light extraction. The pitch separating adjacent features 25 is also substantially equal to the pitch P1 separating the adjacent solder balls 20 that functioned as the etch mask for texturing the light transmissive substrate 10, i.e., forming the features 25.

The dry etch for forming the trenches using the etch mask of the solder dots 20 is typically an anisotropic etch process. As used herein, an "anisotropic etch process" denotes a material removal process in which the etch rate in the direction normal to the surface to be etched is greater than in the direction parallel to the surface to be etched. For example, the dry etch process used at this stage of the present disclosure may be a reactive ion etch (RIE) process, which can have a high anisotropic etch character. This provides a high depth H1 to width W1 ratio for features 25 formed by the etch process using the solder dots 20 as an etch mask. For example, the features 25 may have a depth to width ratio of 1:1. In some embodiments, the features 25 may have a depth to width ratio as great as 4:1. In some other embodiments, the etch process at this state of the present disclosure may include a dilute hydrofluoric (HF) etch, e.g., $HF:H_2O=1:50$ for 10-20 minutes for a light transmissive substrates 10 composed of glass, or a nitric acid ($HNO_3$) and HF etch.

The height H1 of the features 25 is typically dependent on the depth of the trenches 30, which can be a function of etch time. The longer the etch process continues, the deeper the trenches 30 are formed into the textured surface of the light transmissive substrate 10, the greater the height H1 of the features 25. Similar to the width W1 of the features 25, the height of the features H1 is comparable in dimension to the wavelength of the light being produced by the LED structure 5.

In some embodiments, to provide for enhanced light extraction from LED containing devices, the exposed portions of the light transmissive substrate 10 are etched to provide features 25 having a height H1 ranging from 0.4 microns to 1.5 microns. In another embodiment, the exposed portions of the light transmissive substrate 10 are etched to provide features 25 having a height H1 ranging from 0.5 microns to 1.0 microns. In yet another embodiment, the exposed portions of the light transmissive substrate 10 are etched to provide features 25 having a height H1 ranging from 0.55 microns to 1.0 micron. In an even further embodiment, the exposed portions of the light transmissive substrate 10 are etched to provide features 25 having a height H1 ranging from 0.75 microns to 1.0 micron.

Figure 5:
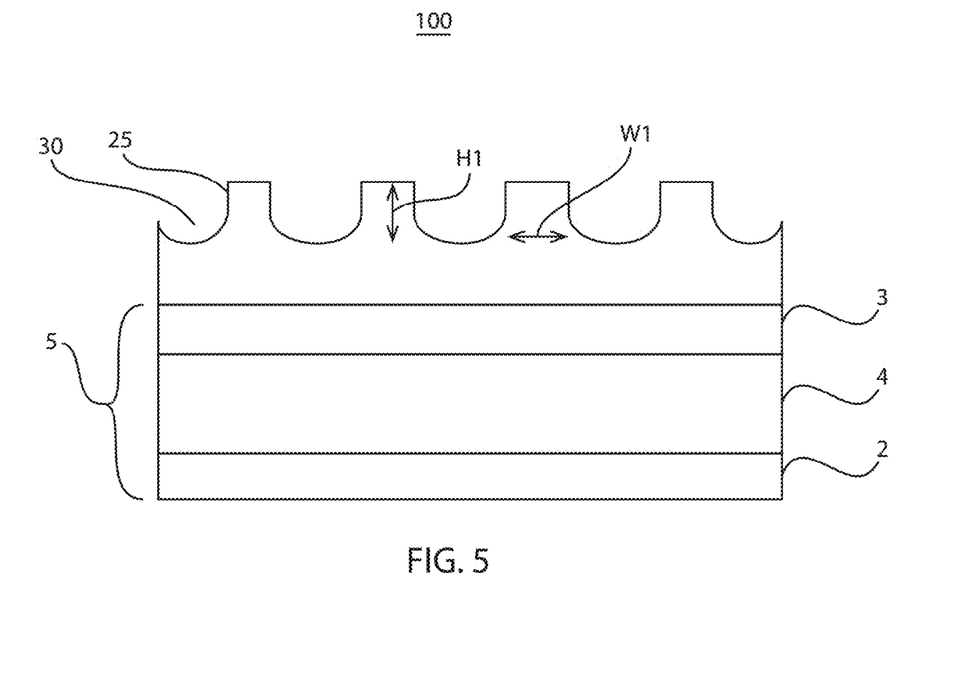
FIG. 5 is a side cross-sectional view depicting removing the etch mask of the plurality of metal particles following etching of the substrate, in accordance with one embodiment of the present disclosure.

Referring to FIG. 5, the solder balls 20 are typically removed with a dry etching process. If the solder balls 20 are not completely removed, a wet etch may be performed to completely remove the solder balls 20. In some embodiments, the wet etching process for removing the solder balls 20 can further taper the features 25 of the textured surface for the light transmissive substrate 10. Generally, the features 25 have substantially the same dimensions after removing the solder balls 20 that the features 25 had before removing the solder balls 20.

Figure 6:
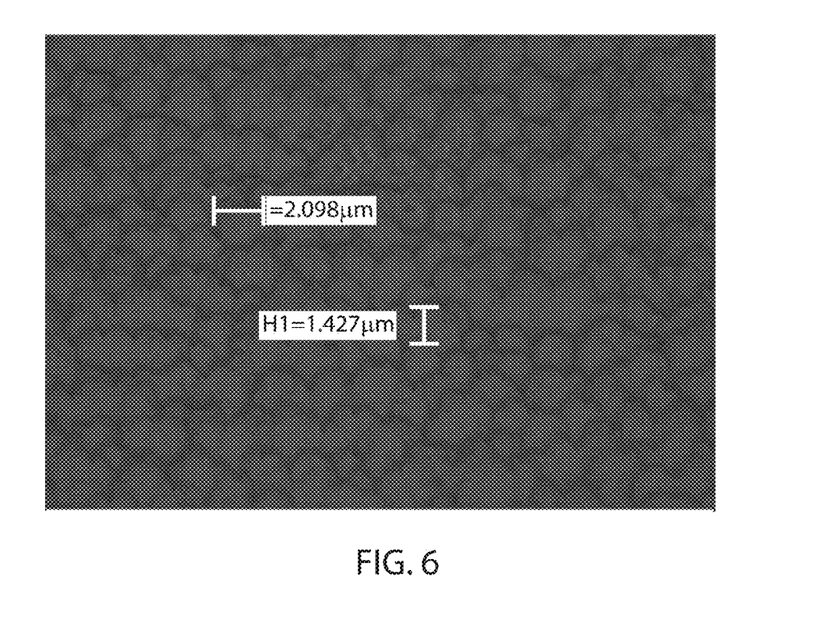
FIG. 6 is a photograph of one embodiment of a textured surface in which the feature size and density has been tuned in accordance with the method depicted in FIGS. 1-4.

Referring to FIGS. 5 and 6, a light emitting diode (LED) 100 is disclosed herein, which in some embodiments has a textured surface that has been tuned to have features 25 with dimensions comparable to the wavelength of light being emitted by the LED structure 5. As described above, the light transmissive substrate 10 has a textured surface, wherein the height H1 and width W1 of the features 25 in the textured surface are comparable in dimension to the light wavelength being emitted by the LED. By providing features 25 with dimensions similar to the wavelength of light from the LED structure 5, the features 25 of the textured surface reduce light trapping, and therefore increase the efficiency and light extraction of the LED structure 5. For example, the wavelength of light emitted from the LED structure 5 may range from 350 nm to 750 nm. In other examples, the wavelength of light emitted from the LED structure 5 may range from 400 nm to 700 nm. In some embodiments, to provide that the features 25 with dimensions comparable to the wavelength of light produced by the LED structure 5 in the above example, the width W1 of the features 25 typically ranges from 0.4 microns to 1.5 microns, and in some examples may range from 0.5 microns to 1.0 microns. In some examples, the width W1 of the features 25 is equal to 0.525 microns, 0.550 microns, 0.575 microns, 0.600 microns, 0.625 microns, 0.650 microns, 0.675 microns 0.700 microns, 0.725 microns, 0.750 microns, 0.775 microns, 0.800 microns, 0.825 microns, 0.850 microns, 0.875 microns, 0.900 microns, 0.925 microns, 0.950 microns, 0.975 microns and 1 micron, as well as any range including a minimum value and a maximum value selected from the above examples.

To provide that the features 25 comparable in dimension to the wavelength of light produced by the LED structure 5 in the above example, the height H1 of the features 25 typically ranges from 0.4 microns to 1.5 microns, and in some examples may range from 0.5 microns to 1.0 microns. In some examples, the height H1 of the features 25 may range from 0.525 microns, 0.550 microns, 0.575 microns, 0.600 microns, 0.625 microns, 0.650 microns, 0.675 microns 0.700 microns, 0.725 microns, 0.750 microns, 0.775 microns, 0.800 microns, 0.825 microns, 0.850 microns, 0.875 microns, 0.900 microns, 0.925 microns, 0.950 microns, 0.975 microns and 1 micron, as well as any range including a minimum value and a maximum value selected from the above examples.

As a result of etching with the solder dot mask pattern, the textured surface of the light transmissive substrate 10 may have a surface density of the features 25 that may be between about $10^8$ to $10^9$ features/cm$^2$. The features 25 may have a sidewall angle that is perpendicular to the plateau upper surface, or the features 25 may have an angled sidewall, in which the angle of the sidewall is in the range of between about 45 and about 80 degrees.

Figure 7:
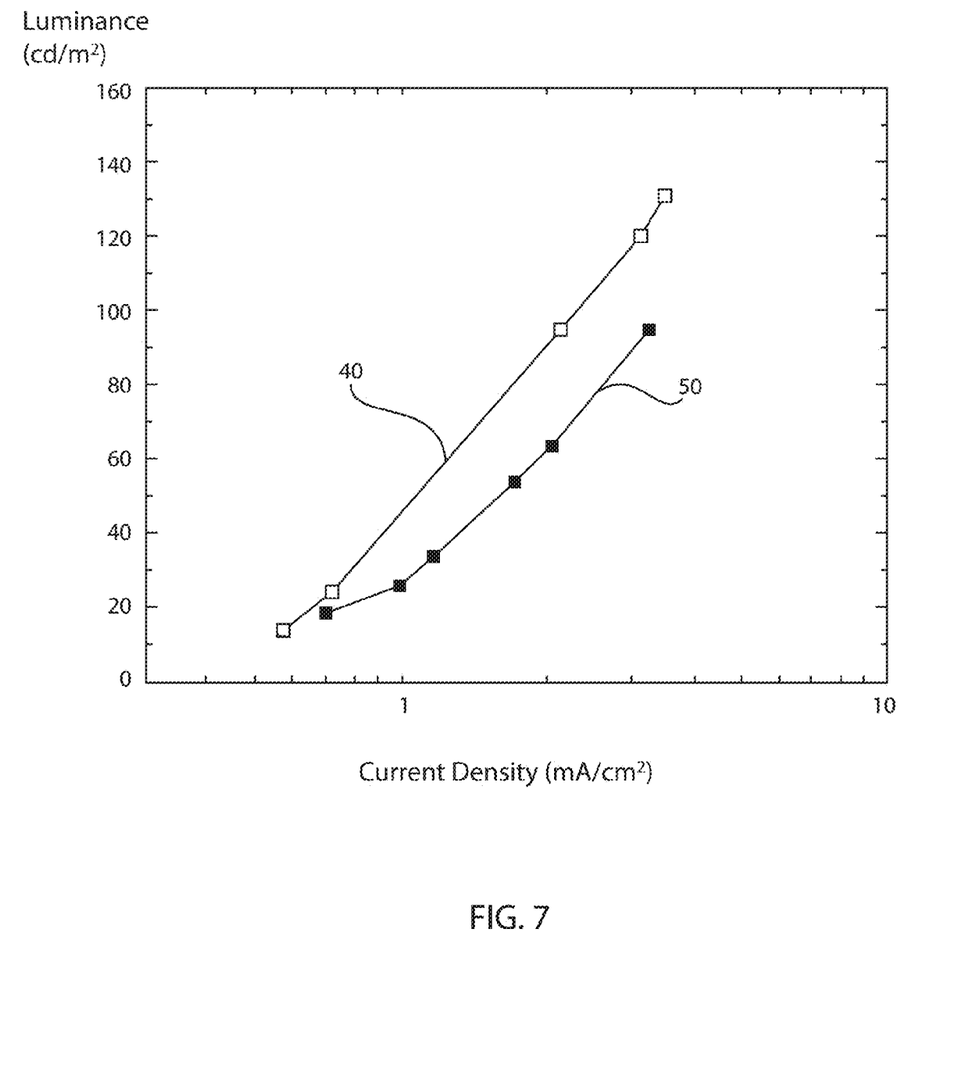
FIG. 7 is a plot of luminance as a function of current density for an LED including a textured light transmissive substrate in comparison to an LED having a smooth glass substrate, in accordance with the present disclosure.

FIG. 7 is a plot of luminance as a function of current density for an LED containing device including a textured light transmissive substrate 10, as described above with reference to FIGS. 1-6, in comparison to an LED having a smooth glass substrate that is not textured. The plot line identified by reference number 40 is the luminance measured from a LED including a textured light transmissive substrate in accordance with the present disclosure. The plot line identified by reference number 50 is the luminance measured from a similarly structure comparative example that does not include a light transmissive substrate that is textured. The light transmissive structure of the LED structure that provided the data that produced the plot line identified by reference number 50 had a smooth non textured light transmissive substrate that was susceptible to light trapping. Simple texturing of the light transmissive substrate, increases light out coupling by approximately 1.3× (1.3 times) in comparison to a device including a smooth non textured light transmissive substrate. Texturing of the light transmissive substrate as taught by the present disclosure, i.e., optimizing the feature size, further increases the output coupling by 2×, i.e., two times.

Methods as described herein may be used in the fabrication of light emitting diodes (LEDs). The end product can be any product that includes LEDs, ranging from toys and other low-end applications to advanced computer products having a display, a keyboard or other input device, and a central processor. The present embodiments may be part of a LED device or circuit, and the circuits as described herein may be part of a design for an integrated circuit chip, a solar cell, a light sensitive device, etc.

Having described preferred embodiments of a device and method for uniformly distributed self-assembled solder dot formation for high efficiency solar cells (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims.

Having thus described aspects of the invention, with the details and particularity required by the patent laws, what is claimed and desired protected by Letters Patent is set forth in the appended claims:

1. A method for fabricating a light emitting device comprising:
   providing a light emitting diode (LED) structure that is present on a light transmissive substrate;
   forming a metal containing layer directly on a surface of the light transmissive substrate;
   annealing the metal containing layer to form a plurality of metal particles each having a uniform size and being evenly spaced apart from each other;
   etching exposed portions of the light transmissive substrate using the plurality of metal particles as an etch mask to form a textured surface having a plurality of uniform plateaued features separated from each other by evenly spaced apart curved recessed portions partially extending within the light transmissive substrate, the plurality of features being comparable in dimension to a wavelength of light produced by the LED structure; and
   removing the plurality of metal particles.

2. The method of claim 1, wherein tuning a feature size of a texture to be comparable in dimension to the wavelength of light increases light extraction from the LED structure in comparison to when the feature size of the texture is substantially less or substantially more than the wavelength of light.

3. The method of claim 1, wherein the light transmissive substrate is composed of glass, quartz, monocrystalline silicon or a combination thereof.

4. The method of claim 1, wherein the LED structure comprises a light emitting active element of an organic light emitting diode (OLED) or the LED structure is comprised of an inorganic semiconductor material.

5. The method of claim 4, wherein the light emitting active element of the OLED is selected from the group consisting of polyacetylenes (PA), polyanilines (PANI), polypyrroles (PPy), polythiophenes (PT), poly-para-phenylenes (PPP), poly-para-phenylene-vinylenes (PPV), oligoacenes, oligothiophenes, triarylamines, oligo-para-phenylenes, N,N'-Bis(naphthalen-1-yl)-N,N'-bis(phenyl) benzidine ($C_{44}H_{32}N_2$)(NPB), 2-TNATA,4,4',4"-Tris-(N-(naphthylen-2-yl)-N-phenylamine)triphenylamine ($C_{66}H_{48}N_4$)(TNATA), Tris(4-carbazoyl-9-ylphenyl)amine ($C_{54}H_{36}N_4$) (TCTA), 1,3,5-tris[4-(diphenylamino)phenyl]-benzene (TDAPB), TDATA, Tris(8-hydroxyquinolinato)aluminum (Al($C_9H_6NO$)$_3$)(Alq3), Bis(2-methyl-8-quinolinolato-N1,O$_8$)-(1,1'-Biphenyl-4-olato)aluminum ($C_{32}H_{25}AlN_2O_3$) (Balq), 4,4'-Bis(N-carbazolyl)-1,1'-biphenyl ($C_{36}H_{24}N_2$)(CBP) and combinations thereof.

6. The method of claim 4, wherein the light emitting active element of the LED comprised of inorganic semiconductor material is selected from the group of (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

7. The method of claim 1, wherein the metal containing layer comprises Sn, Pg, Sb, Bi or combinations thereof.

8. The method of claim 7, wherein a thickness of said forming the metal containing layer on the surface of the light transmissive substrate and an annealing temperature for said annealing of the metal containing layer to provide said plurality of metal particles is tuned so that the metal particles in the plurality of metal particles in the etch mask have a width dimension comparable with the wavelength of the light produced by the LED structure.

9. The method of claim 1, wherein said etching produces features having a height dimension comparable with the wavelength of the light produced by the LED structure.

10. The method of claim 1, wherein said wavelength of the light produced by the LED structure ranges from 450 nm to 700 nm, a height dimension of said features ranges from 0.5 microns to 1 micron, and a width dimension of said features ranges from 0.5 microns to 1 micron.

11. A method of fabricating a light emitting device (LED) comprising:

providing a light emitting diode (LED) structure that is present on a light transmissive substrate;

forming a metal containing layer directly on a surface of the light transmissive substrate and annealing the metal containing layer, wherein a layer thickness and anneal temperature for the metal containing layer is tuned to form a plurality of metal particles each having a uniform size and being evenly spaced apart from each other to act as an etch mask, the etch mask providing a pattern with a feature size for a textured surface having a plurality of uniform plateaued features separated from each other by evenly spaced apart curved recessed portions partially extending within the light transmissive substrate, the plurality of features being comparable in dimension with a wavelength of light produced by the LED structure; and etching the light transmissive substrate using the etch mask to transfer the pattern including said feature size into said light transmissive substrate providing a texture in the light transmissive substrate, wherein the feature size of the texture is comparable in dimension with a wavelength of light produced by said LED structure.

12. The method of claim 11, wherein tuning the feature size of the texture to be comparable in dimension with the wavelength of light increases light extraction from the LED structure in comparison to when the feature size of the texture is substantially less or substantially more than the wavelength of light.

13. The method of claim 11, wherein the LED structure comprises a light emitting active element of an organic light emitting diode (OLED) or an inorganic semiconductor material.

14. The method of claim 11, wherein the metal containing layer comprises Sn, Pg, Sb, Bi and combinations thereof.

15. The method of claim 11, wherein said etching produces features having a height dimension comparable with the wavelength of the light produced by the LED structure.

16. The method of claim 11, wherein said wavelength of the light produced by the LED structure ranges from 450 nm to 700 nm, a height dimension of said features ranges from 0.5 microns to 1 micron, and a width dimension of said features ranges from 0.5 microns to 1 micron.

* * * * *